(12) United States Patent
Montrose et al.

(10) Patent No.: US 9,043,179 B2
(45) Date of Patent: May 26, 2015

(54) VOLTAGE-DRIVEN INTELLIGENT CHARACTERIZATION BENCH FOR SEMICONDUCTOR

(75) Inventors: Charles J. Montrose, Clintondale, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 12/985,443

(22) Filed: Jan. 6, 2011

(65) Prior Publication Data

US 2012/0179409 A1    Jul. 12, 2012

(51) Int. Cl.
*G01R 31/00* (2006.01)
*G01R 31/14* (2006.01)
*G01R 31/319* (2006.01)
*G01R 31/3193* (2006.01)

(52) U.S. Cl.
CPC .... *G01R 31/31924* (2013.01); *G01R 31/31935* (2013.01)

(58) Field of Classification Search
CPC .................. G01R 31/31903; G01R 31/31905; G01R 31/31908; G01R 31/31935
USPC ....................................................... 702/117
See application file for complete search history.

(56) References Cited

U.S. PATENT DOCUMENTS

| | | | | |
|---|---|---|---|---|
| 5,189,505 A | * | 2/1993 | Bartelink | ....................... 257/419 |
| 5,231,598 A | | 7/1993 | Vlahos | |
| 5,638,005 A | * | 6/1997 | Rajan et al. | .............. 324/754.22 |
| 5,654,127 A | * | 8/1997 | Leedy | ........................... 430/315 |
| 6,295,729 B1 | * | 10/2001 | Beaman et al. | ................. 29/843 |
| 6,429,677 B1 | | 8/2002 | Montrose | |
| 6,437,956 B1 | | 8/2002 | Montrose | |
| 6,598,182 B1 | | 7/2003 | Lowitz et al. | |
| 6,611,146 B2 | | 8/2003 | Montrose | |
| 6,823,282 B1 | | 11/2004 | Snyder | |
| 6,904,471 B2 | * | 6/2005 | Boggs et al. | ...................... 710/8 |
| 6,940,285 B2 | | 9/2005 | Montrose et al. | |
| 7,076,420 B1 | | 7/2006 | Snyder et al. | |
| 7,197,626 B2 | | 3/2007 | Jaffrey | |
| 7,210,087 B2 | | 4/2007 | Mukai et al. | |
| 7,246,278 B2 | | 7/2007 | Stocken et al. | |

(Continued)

OTHER PUBLICATIONS

Ritchey et al., "Busses: What Are They and How Do They Work?", Dec. 2000, PCB Design.*

(Continued)

*Primary Examiner* — Andrew Schechter
*Assistant Examiner* — Regis Betsch
(74) *Attorney, Agent, or Firm* — Schmeiser, Olsen & Watts, LLP; William H. Steinberg

(57) ABSTRACT

A system for testing a plurality of transistors on a wafer having a storage device or personal computer connected via a bus to a plurality of drivers. Each of the voltage drivers having a microcontroller adapted to receive test parameters and provide test data from a plurality of voltage drivers. By utilizing a bus structure, the personal computer can look on one bus for flags indicating test data is available from a driver and receive the data. In addition a bus may be used to provide test parameters to the drivers. In this manner, multiple drivers may be run at the same time incorporating multiple tests. When data is available it is transferred to the personal computer, for providing test parameters to a plurality of drivers, and connected via a second bus for receiving test results from the plurality of drivers.

14 Claims, 9 Drawing Sheets

(56) References Cited

U.S. PATENT DOCUMENTS

| | | |
|---|---|---|
| 2005/0138506 A1 | 6/2005 | Stocken et al. |
| 2005/0289415 A1* | 12/2005 | Dean et al. ............... 714/724 |
| 2007/0027593 A1* | 2/2007 | Shah et al. ............... 701/30 |
| 2009/0113173 A1 | 4/2009 | Jaffrey |
| 2010/0225466 A1* | 9/2010 | Liu et al. ............... 340/514 |
| 2010/0318313 A1* | 12/2010 | Agarwal et al. ............... 702/117 |

OTHER PUBLICATIONS

B T Tan, "Generalized protocol for parallel-port handshaking", Nov. 1989, Microprocessor and Microsystems vol. 13 No. 9, pp. 597-606.*

* cited by examiner

VOLTAGE-DRIVEN INTELLIGENT CHARACTERIZATION BENCH FOR SEMICONDUCTOR

BACKGROUND

Aspects of the present invention are directed to semiconductor characterization. More specifically the present invention is directed to an apparatus, system and method for parallel and independent electrical characterization of a plurality of MOSFET devices with sub-millisecond (msec) time resolution.

As semiconductor manufacturing decreases the size of the components on a wafer the number of components increases exponentially. As a result the number of components requiring testing per wafer has also increased. This may cause the test station to become a choke point in the manufacture of wafers. Therefore there is a need for a method, system and apparatus that permits testing of components at an increased rate. The alternative is for the percentage of components tested to be reduced potentially affecting the quality assurance of the line.

Traditionally, electrical characterization of semiconductor devices (including inline and offline characterization of device parametrics and reliability) involves an extended matrix of test/stress conditions, and a reasonable sample size (e.g. 5 devices) for each condition is required for statistics. Such characterization is usually performed using a rack of electronics (including precision voltage sources, DVM's, a switch matrix, etc.) controlled by a central computer.

In the case of wafer-level characterization, such test/stress is carried out using wafer probe stations where the semiconductor device(s) and the rack of test equipment is electrically couple through a set of probes. In the case of long-term (e.g. longer than a week) reliability characterization where it is not practical to use probe stations due to the huge time consumption, such test/stress is conducted by a module-level system where semiconductor devices from a plurality of silicon dies are electrically connected to the rack of test equipments through wire-bonding to a substrate which is plugged into a test socket.

Note, however, that in both wafer-level and module-level cases described above, the test/stress condition is set by the test equipment attached to the probe set(s) (for wafer-level) or module(s) (for module-level). Therefore, the matrix of test/stress conditions need to be carried out one at a time (in serial), which significantly hinders the efficiency of characterization. Thus to accomplish the number of tests a design or quality engineer needs to run may take more time than is available or severely delay the delivery of parts. Another result may be to scale down the number of tests, potentially resulting in lower quality parts.

Furthermore, it is becoming critical in recent advanced semiconductor technologies for very fast characterization (sub-msec) time resolution. As an example, certain semiconductor degradation mechanism (e.g. BTI, or bias temperature instability of MOSFET devices) shows fast recovery, which makes it challenging to accurately capture the electrical shift under test mode after removing the stress condition. Prior art characterization of multiple semiconductor devices is performed in a sequential approach using a switch matrix, and thus it is not possible to perform such fast characterization.

SUMMARY

In accordance with an aspect of the invention, a method for identifying defects not associated with trivial and/or known root causes in wafer processing is provided and includes performing defect inspection of a plurality of wafer designs, identifying defects in each of the plurality of designs as not being associated with a trivial and/or known root cause, determining a physical location on each design where each of the defects occurs and correlating the physical locations where each of the defects occurs with cell instances defined at those physical locations.

In this invention, the Voltage-driven Intelligent Characterization Bench (VICB) architecture is disclosed to address the limitation of traditional semiconductor test/stress system.

With the VICB architecture, as shown schematically in FIG. 2, characterization of each of the semiconductor devices is conducted by an independent Driver Channel which is capable of independently controlling stress, test, timing and rapid data acquisition. Therefore, each Driver Channel within a VICB is essentially an entirely independent semiconductor device characterization system. An individual semiconductor device to be tested is connected to an individual Driver Channel on a VICB through a set of probes on a probe station (for wafer-level); or through wire-bonding on a module and plugged into a socket (for module-level). A plurality of such semiconductor devices are then connected to a plurality of corresponding Driver Channels, and they can therefore be tested/stressed simultaneously and independently. Fast parallel device parametrics acquisition on a plurality of semiconductor devices with sub-msec time resolution can be achieved over an extended period of time.

For implementing the disclosed VICB architecture, FIG. 3 illustrates the block diagram of a single Driver Channel within a VICB as the preferred embodiment. In this example, each Driver Channel consists of two precision constant-voltage drivers, allowing, for example, for the driving of both the drain and gate of a MOSFET device. Instead of being set from external voltage sources, each of these precision constant-voltage drivers is set by its own independent DAC, which is programmed via a micro-controller using serial peripheral interfaces SPI0 and SPI1. The precision constant-voltage drivers provide sense points for reading back the applied voltage and the current. These sense points are wired to an analog-to-digital converter (ADC) for data acquisition. The ADC provides the data back to the micro-controller via another serial peripheral interface SPI2. The micro-controller is clocked by an accurate temperature-compensated crystal oscillator, so that the timing of the measurements can be precisely defined.

The specifics of the test/stress to be executed are defined by a computer which communicates with the micro-controller via a custom interface bus. The test/stress data is also sent back to this computer for storage over this same interface bus. Once the test has been thus defined and initiated, the micro-controller takes over and the testing is performed independently. At this point, the computer is used simply for data storage.

This architecture allows a plurality of Driver Channels to be implemented without conflict for system resources because the Control Channel has everything it needs to execute the required stress. Also, since each Driver Channel is executing its own program independently, each of the semiconductor devices in the entire system can be tested/stressed independently in parallel with different conditions and procedures. Therefore, the system is capable of running a plurality of different experiments simultaneously and independently.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

While the disclosure has been described with reference to exemplary embodiments, it will be understood by those skilled in the art that various changes may be made and equivalents may be substituted for elements thereof without departing from the scope of the disclosure. For instance, wafers may contain multiple designs to accommodate manufacturing multiple products within the same wafer. As such, the present invention can be applied on wafers containing a plurality of designs. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

Figure 1:
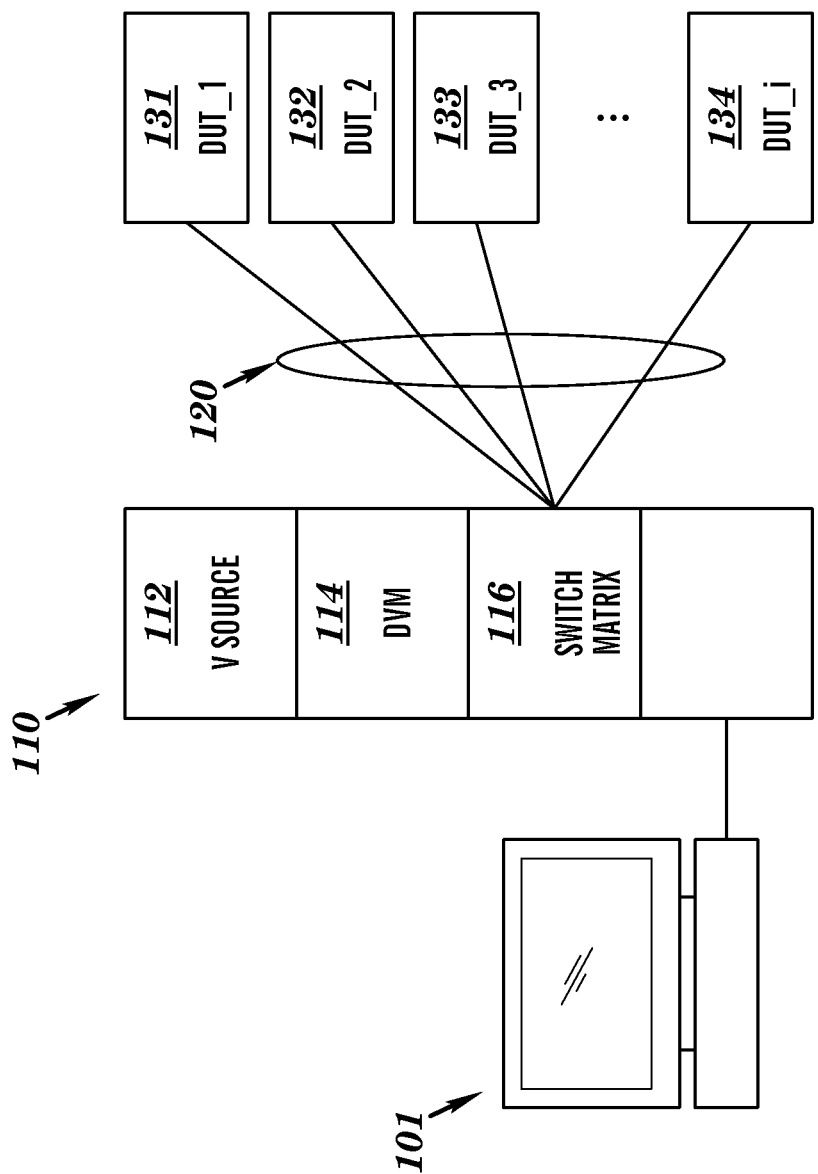
FIG. 1 is a schematic diagram of a prior art semiconductor characterization system.

FIG. 1 illustrates a prior art semiconductor characterization system. The system comprises a central controller 101. Central controller 101 may be a personal computer, or other means capable of receiving data and sending test requests and/or parameters. Controller 101 provides a signal to and receives a signal from a test equipment rack 110. The test equipment rack 110 comprises a voltage source 112, a digital voltmeter 114 and a switch matrix 116. The switch matrix 116 is electrically connected sets of probes or wire-bonds 120 to the devices under test (DUT) 131-134. The switch matrix 116 electrically switches from one probe to another individually to test each of the DUTs 131-134. This individual switching between DUTs limits the process time required for completing the test of the device. This testing method requires that each device be tested, the results be received before moving to the next DUT. As there may be several hundred DUTs that may require testing, it is clear that testing for a wafer will take an excessive amount of time.

Figure 2:
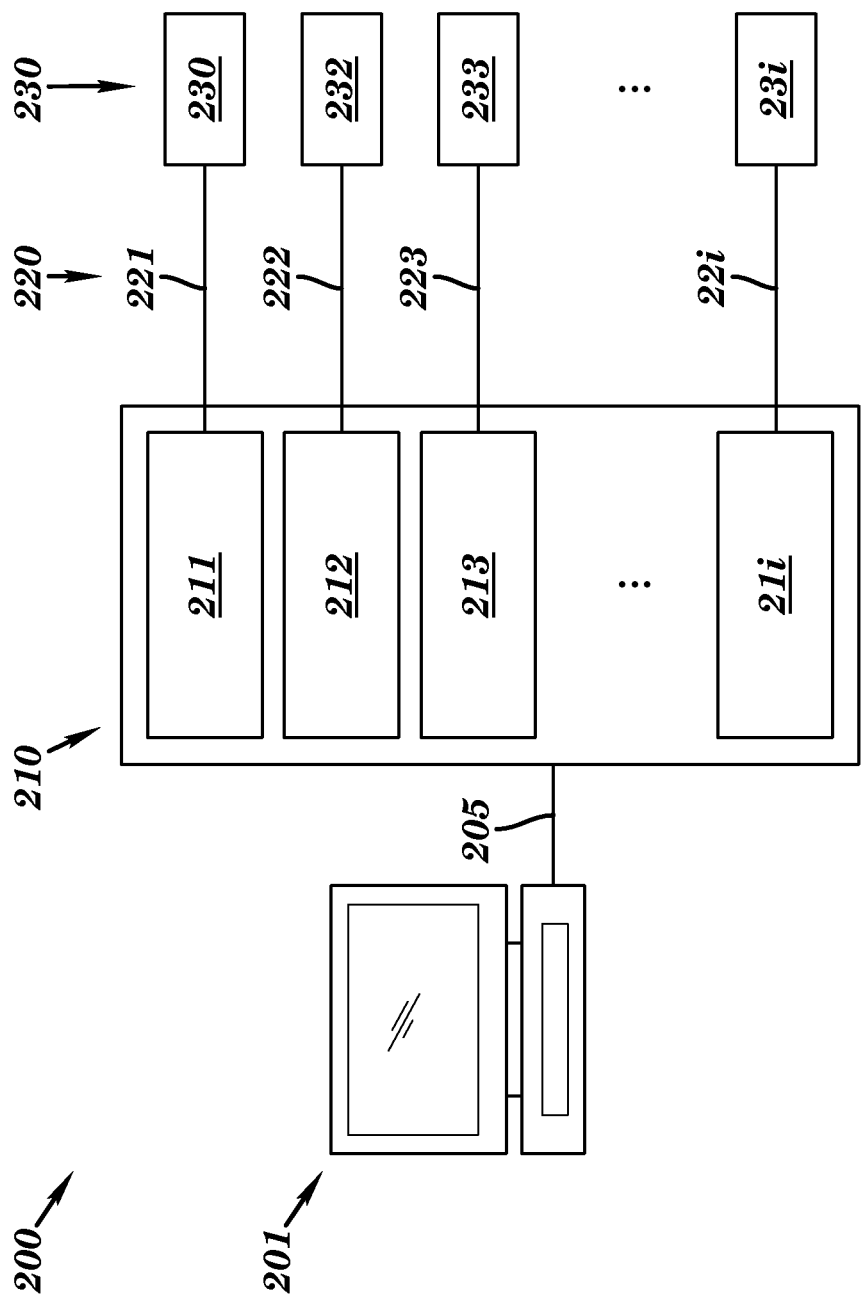
FIG. 2 is a schematic diagram of a semiconductor characterization system utilized by embodiments herein.

FIG. 2 is a system embodying an embodiment of the applicant's invention. The system 200, comprises a data storage system such as a personal computer 201. While a personal computer is illustrated other systems or devices may be utilized such as a main frame or a system connected to an internal network or the internet. The personal computer 201 is utilized to store data received from Drivers 210 and in addition to provide test parameters to Drivers 210. Drivers 210, comprises a plurality of drivers 211, through 21$i$. The number of drivers 210 is limited only by the number of DUTs required to be tested. Drivers 210 are connected via a communication system 205, a dual unidirectional 8-bit hand shaked data bus, illustrated further in FIG. 3. The Drivers 210 comprise a plurality of drivers 211-21$i$ which are individually connected to a plurality of DUTs 231-23$i$ via a plurality of probes or wire bonds 221-22$i$. Each of the drivers 211-21$i$ are capable of running the test parameters and recording the data for the individual DUT 211-21$i$ it is connected to. This allows each of the drivers 211-21$i$ to run their tests simultaneously and upon completion of their individual tests, provide the data to the personal computer or storage device 201. The need for this improvement resulted in the design of a new novel communication methodology and a new and novel driver.

Figure 3:
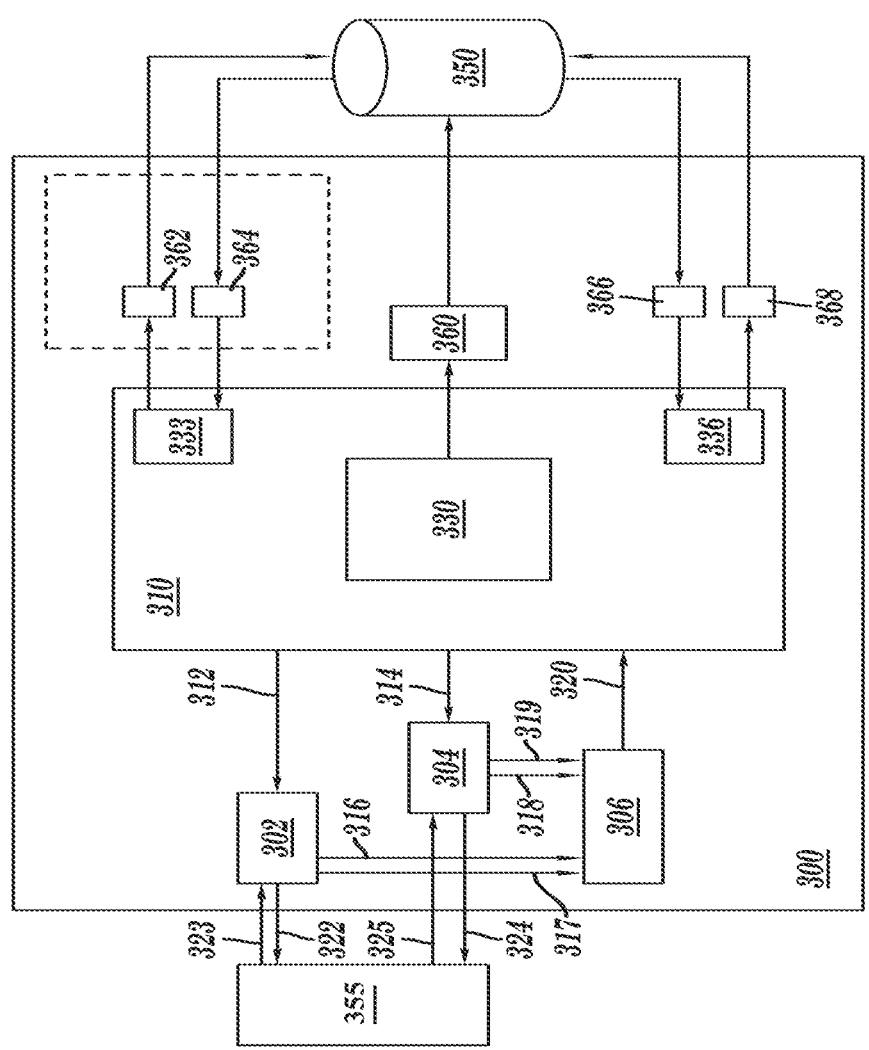
FIG. 3 is a schematic diagram of an embodiment of a driver channel as illustrated in FIG. 2.

FIG. 3 illustrates an exemplary driver channel 300 for an embodiment of the invention. The driver channel 300 comprises a first and a second voltage driver 302 and 304, an analog to digital converter 306, and a microcontroller 310. Voltage driver 302 is electrically connected via a wire bond or probe 322 and 324 respectively to a DUT 355. The voltages at the probe are sensed via sense probes 323 and 325 respectively. For the embodiment illustrated voltage driver 302 may be connected to a Drain of a transistor in DUT 355. Voltage driver 304 may be connected to a gate of a transistor in DUT 355. This will allow the drivers to stress the transistor in DUT 355. Voltage drivers 302 and 304 receive the parameters of the test from microcontroller 310 via inputs 312 and 314 respectively. The drivers 302 and 304 provide both a current and voltage measurement or the results of the stress test to an analog to digital converter 306 via connections 316, 317, 318 and 319 respectively. The voltage driver may sense both the voltage and the current at each of the probes. The analog to digital converter 306 provides the results of the test in digital format to the microcontroller 310 via connection 320.

Microcontroller 310 comprises a memory 330, a latch 333, and a second latch 336. The memory 330 may store the test parameters prior to providing them to voltage drivers 302 and 304. In addition memory 330 stores the test results until they are provided via buffer 360 to the data storage device 370. Latch 333 is connected to an output ready flag 362, and an output read flag 364. Latch 336 is connected to a test parameter ready flag 366 and a test parameter read flag 368. The use of the flags shall be explained further in FIGS. 4, 7 and 8.

Figure 4:
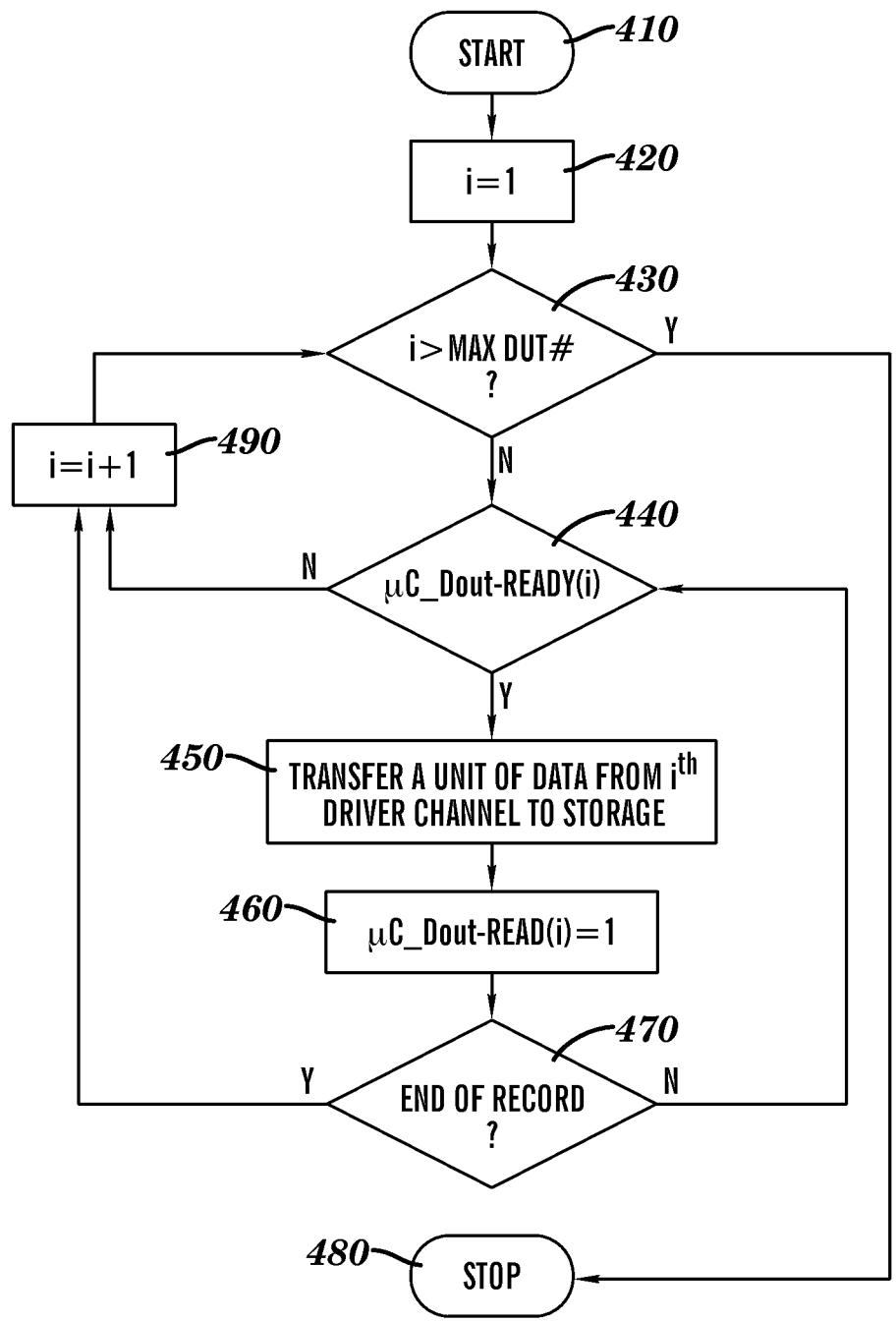
FIG. 4 illustrates a flow chart of an embodiment for receiving data from the voltage driver to the data storage device.

FIG. 4 illustrates a flow chart of an embodiment for collecting data from the voltage driver to the storage device. As discussed in FIG. 2, the connection between the storage device and the driver channels is a unidirectional 8-bit handshake data bus. Step 410 may be to start the method, step 420 may be to set i to 1, i represents a number for a DUT. For example in FIG. 2 the DUTs were numbered 231 through 23$i$, when i=1 being equivalent to 231, and 23$i$ is equivalent to the maximum number of DUTs. Step 430 is to determine if i>than the maximum number of DUTs. If i>is greater than the number on DUTs, is not true then the personal computer 201 of FIG. 2 or storage device 370 of FIG. 3 will move to Step 440. If step 430 determines that i>is greater than the number on DUTs, then step 480 is initiated to stop the process. Step 440 is to read the flag for the voltage driver testing the appropriate DUT. The output flag 362 of the voltage driver 300 will be set if data is ready to be read in the buffer 360. If the flag 362 is not set then step 490 set's i=i+1 and initiates step 430. If the flag 362 is set, then step 450 reads buffer 360 and step 460 sets flag 364 to indicate to the voltage driver 300 that the buffer has been read. Step 470 determines if the end of the record has been read. If not then step 440 is initiated, if the end of the record has been reached then step 490 is initiated.

Figure 5:
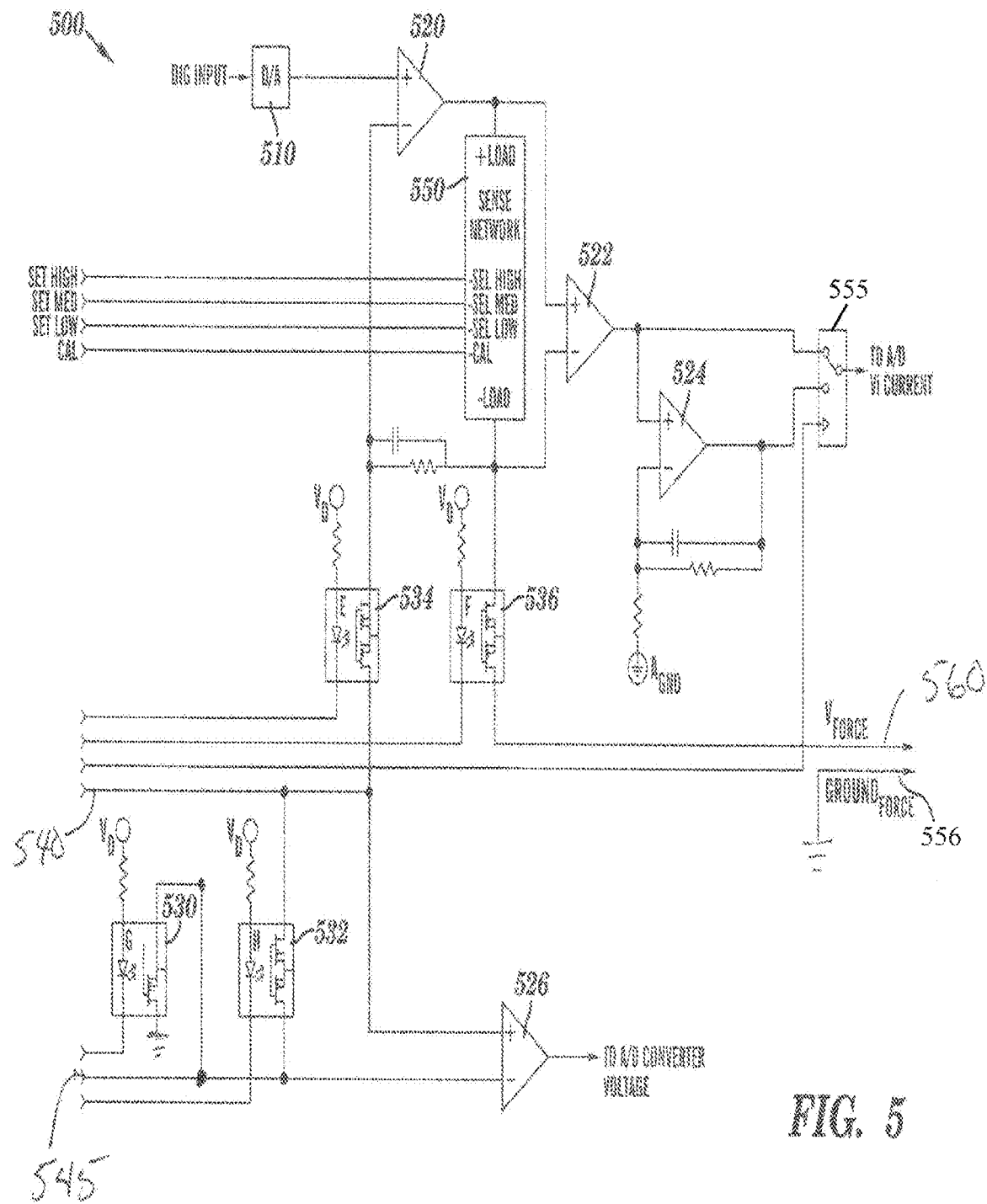
FIG. 5 is a detailed schematic of an embodiment of a voltage driver.

FIG. 5 is a detailed schematic of an embodiment of a voltage driver 500 which represents an embodiment of the voltage driver 302 or 304 of FIG. 3. The voltage driver 500 optically isolates the inputs from the microprocessor from the DUT, this allows for more precise measurements. In addition the drivers may be set such that all of the socket pins (or wafer prober pins) to are tied to ground to minimize the possibility of damage to the DUT from electrostatic discharge. Inputs 312 or 314 of FIG. 3 provide inputs from the microcontroller 310 to the driver 500. The input is received by a digital to analog converter 510. The output of the digital to analog converter 510 is provided to an operational amplifier (op amp) 520 which provide an output to instrumentation amp 522 and load selector 550. Instrumentation amp 522 has two inputs which are set by load selector 550. This allows the driver 500 to select the maximum output current of the circuit based on the DUT being tested. The output of instrumentation amp 522 is provided to op amp 524 and switch 555. Switch 555 provides an output to the analog to digital convertor 306 of FIG. 3. The output is Vi or the current sensed. The output of op amp 524 is also provided to the analog to digital convertor 306.

To permit calibration and to allow the system to ground all of the connections to DUT, a series of optical switches 530, 532, 534, and 536 are provided. The load selector 550 through optical switch 536 provides a voltage, Vforce 560, to the DUT. In addition a ground 556 is provided to the DUT. The sensed voltage from the DUT is provided to instrumentation amp 526 to the analog to digital converter 306 of FIG. 3. In addition, the optical switches 530, 532, 534, and 536 may be set such that Vsense 540 may be set to the same ground as Gsense 545 thereby grounding all of the connections to the DUT. The setting is to close switch 530 thereby connecting Gsense, 545 to ground and by closing switch 532, thereby shorting Vsense 540 to ground. At the same time switches 534 and 536 are opened to open the connection to the inputs to Vforce 560. This shall be clarified further in FIG. 6.

Figure 6:
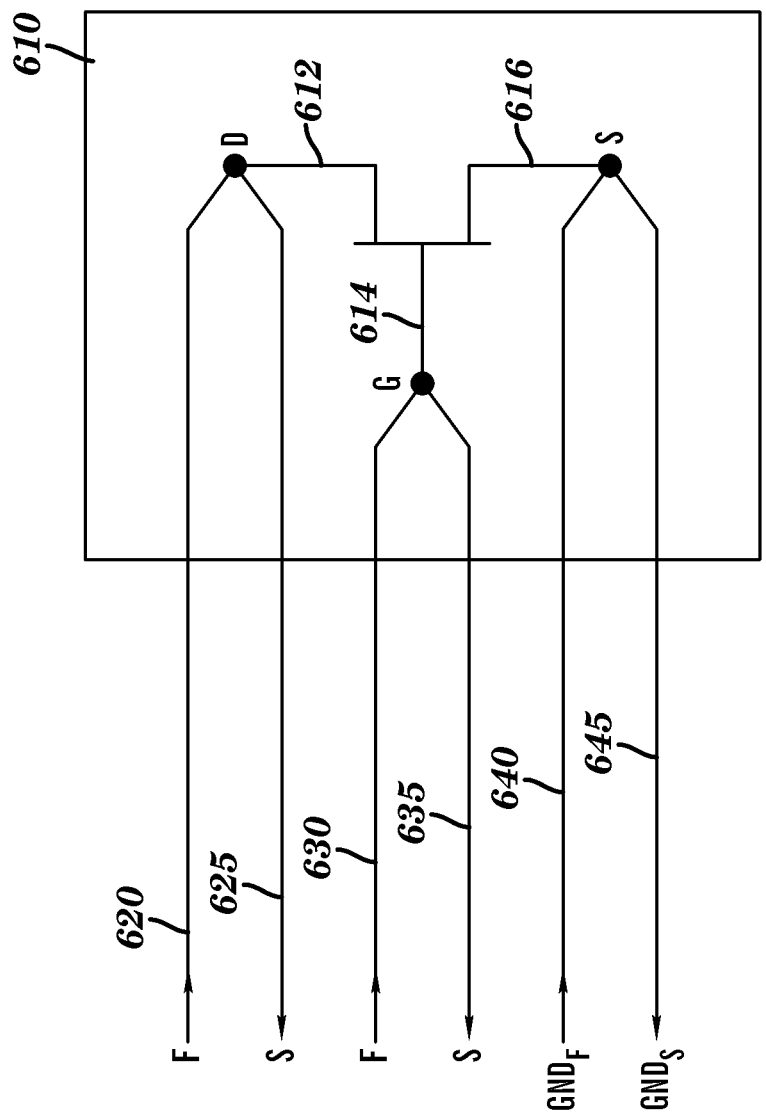
FIG. 6 is a schematic of an embodiment of the test connections to a DUT.

FIG. 6 is a schematic of an embodiment of the test connections to a DUT 610. A DUT 610 may comprise a transistor, with a drain (D) 612, a gate (G) 614, and a source (S) 616. A voltage force signal may be provided via connection 620 from a driver such as voltage driver 302 of FIG. 3 through an input such as input 560 of FIG. 5, to the drain 612 of DUT 610. A voltage force signal may be provided via connection 630 from a driver such as voltage driver 304 of FIG. 3 through an input such as input 560 of FIG. 5, to the gate 614 of DUT 610. Finally a ground force through an input such as ground 556 of FIG. 5 may be provided via a connection 640 to the source 616 of DUT 610. In addition the voltages at the drain 612, the gate 614 and the source 616 are provided via outputs 625, 635, and 645. For example output 625 or 635 may be provided to input 540 Vsense of FIG. 5. Output 645 may be provided to an input Gsense 545 of FIG. 5. By shorting outputs 625 and 635 to ground 645, the complete loop is shorted, thereby preventing the build up of static electricity on the probes. The connections 620, 625, 630, 635, 640 and 645 may be provided as probes or wire bonds.

Figure 7A:
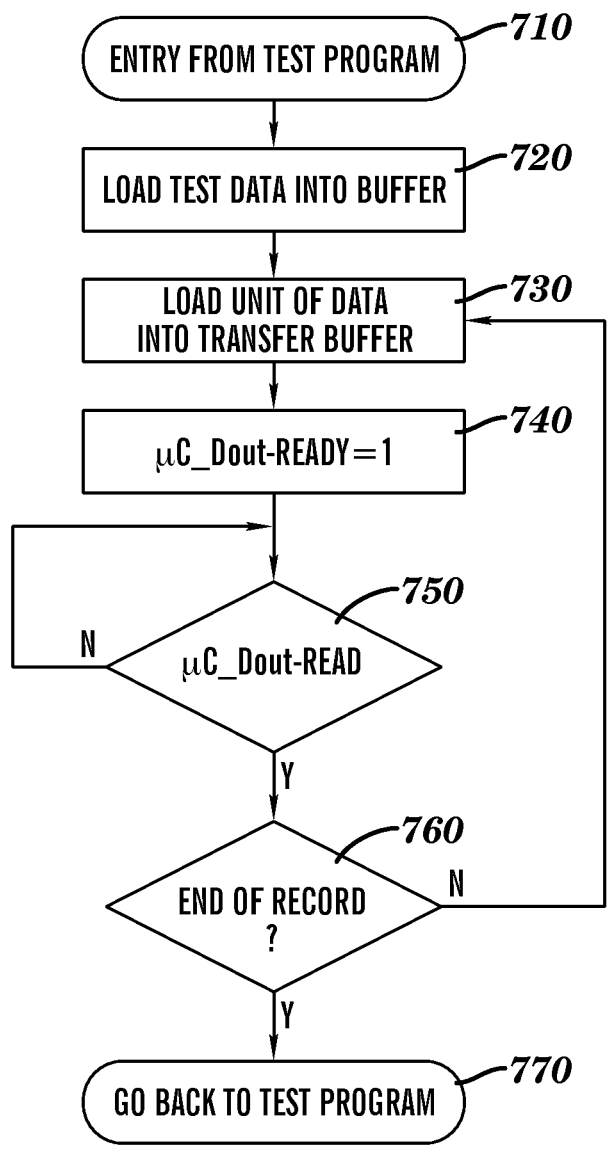
FIG. 7A and FIG. 7B illustrate flow charts of embodiments for the transfer of data from the voltage driver to the storage device.
Figure 7B:
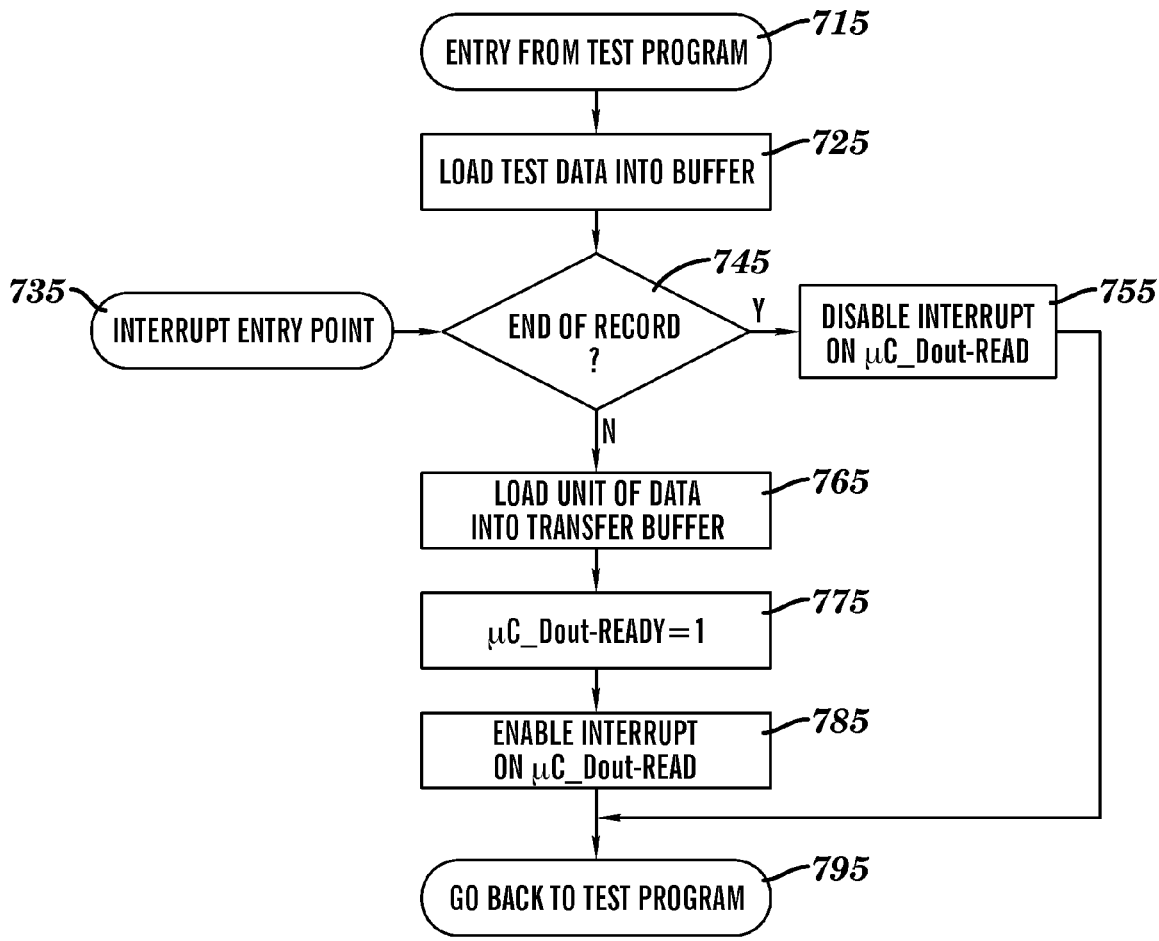

FIG. 7A and FIG. 7B illustrate flow charts of embodiments for the transfer of data from the voltage driver to the storage device. FIG. 7A illustrates the method for providing the data from the voltage driver to the storage device. Step 710 may be to enter data from the test program. Step 720 may be to load test data into the buffer, for example buffer 360 of FIG. 3. Step 730 may be to load the data into a transfer buffer. Step 740 may be to set the output ready flag as ready, such as output ready flag 362 of FIG. 3 and have the storage device read the buffer. Step 750 may be to determine if the storage device 370 of FIG. 3 set the output read flag 364 of FIG. 3 after it has read the data in the buffer. When the data has been read step 760 determines if the end of the data record has been sent. If not, then step 730 is repeated, if the end of the record has been read, step 770 is for the microcontroller 310 to return to the test program mode FIG. 7B is an alternative flow chart for providing test data to the storage device. Step 715 may be to enter data from the test mode. Step 725 may be to load test data into the buffer. Step 745 is to determine if the end of the record has been reached. If the end of the record has been reached step 755 is to disable the interrupt on the microcontroller's data out flag. If the end of the record has not been reached step 765 may be to load a unit of data into the transfer buffer. Step 775 may be to set the data out flag. Step 795 may be to return to the test program.

Figure 8:
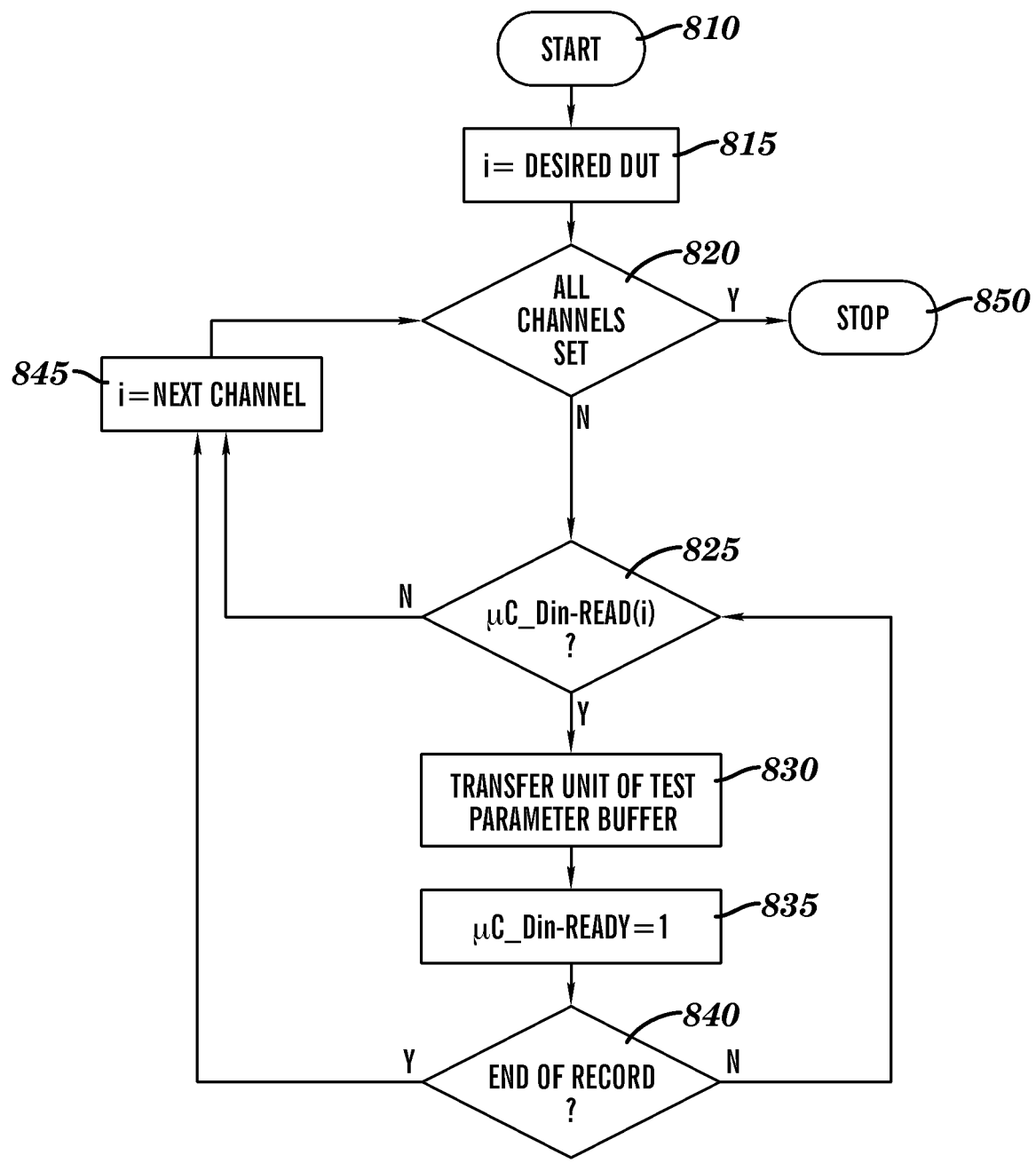
FIG. 8 illustrates a flow chart for transferring test parameters from the storage device to the voltage driver.

FIG. 8 illustrates a flow chart for transferring test parameters from the storage device to the voltage driver. Step 810 is to start the process. Step 815 may be to set "i" to the desired DUT. For example after reading the data as discussed in FIG. 4, the DUT that provided the data, may have new test parameters provided. Another embodiment may be to start at the first DUT (i=1) and proceed through the DUTs serially. Step 820 may be to determine if all of the DUTs have been provided their test data. If true, then step 850 is to stop. If not true, step 825 may be to determine if the flag indicating that the earlier test parameters have been read by reading for example flag 368 of FIG. 3. If the flag 368 indicates it has not been read, the system may enter a wait stage or step 845 "i" may be set to the next DUT the system wishes to update and initiate step 820. If the flag 368 indicates it has been read, step 830 may be to transfer the test parameter to the microcontroller 310 of FIG. 3. It is also possible to only transfer a portion of the test parameter. Step 835 may be to set the data ready flag 366 such that the Microcontroller 310 reads the data and resets flag 368 of FIG. 3. Step 840 may be to determine if the end of the record or if all of the portions of the test parameters have been transferred. If the data has all be transferred, step 845 is initiated. If there is still data to be transferred, step 825 is initiated.

While the disclosure has been described with reference to exemplary embodiments, it will be understood by those skilled in the art that various changes may be made and equivalents may be substituted for elements thereof without departing from the scope of the disclosure. For instance, wafers may contain multiple designs to accommodate manufacturing multiple products within the same wafer. As such, the present invention can be applied on wafers containing a plurality of designs. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

We claim:

1. A system for testing a plurality of semiconductor devices, said system comprising:
   a storage device for storing data; and
   a plurality of driver channels, each driver channel connected to the storage device via a bus, each driver channel configured to be connected to a respective semiconductor device of the plurality of semiconductor devices under test;
   wherein the plurality of driver channels are configured to independently and simultaneously test, using test parameters, the respective semiconductor device to which each driver channel is connected, and provide test results from the test to the storage device;
wherein each driver channel comprises:
a first voltage driver connected to the respective semiconductor device and having a first input for the respective semiconductor device;
a second voltage driver connected to the respective semiconductor device and having a second input for the respective semiconductor device;
a microcontroller configured to receive the test parameters from the storage device and set the test parameters in the first voltage driver and the second voltage driver; and
a first set of optical switches in the first voltage driver and a second set of optical switches in the second voltage driver, wherein all connections between the respective semiconductor device under test and both the first voltage driver and the second voltage driver are simultaneously grounded upon all optical switches of the first set and the second set of optical switches being closed.

2. The system of claim 1, wherein the bus is a dual unidirectional 8-bit hand shaked data bus.

3. The system of claim 1, wherein the storage device is a computer.

4. The system of claim 1, wherein each driver channel comprises a flag which when set denotes that the test results are available to be provided to the storage device.

5. The system of claim 1, wherein each driver channel further comprises an analog-to-digital converter, and wherein for each driver channel, the first and second voltage drivers are configured provide the test results to the analog-to-digital converter and the analog-to-digital converter is configured to provide the test results in digital form to the microcontroller.

6. The system of claim 1, wherein for each driver channel, the first and second voltage drivers are constant voltage drivers which are set within the driver channel and are not set by voltage sources external to the driver channel.

7. The system of claim 1, wherein upon all optical switches of the first set and the second set of optical switches being closed, a voltage sensed signal from a first probe location on the respective semiconductor device is grounded by a first and second optical switch of the first set of optical switches being closed, and wherein a voltage force signal from the first voltage driver to the respective semiconductor device is grounded by being connected to the first probe location on the respective semiconductor device so as to constrain the voltage force signal to be at a same voltage level as the voltage sensed signal.

8. A system for testing a plurality of transistors on a wafer comprising:
a plurality of driver channels; and
a personal computer connected to each driver channel for providing test parameters to each driver channel and for receiving test results from each driver channel, wherein each driver channel is configured to be connected to a respective transistor of the plurality of transistors on the wafer,
wherein the plurality of driver channels are configured to independently and simultaneously test the respective transistor to which each driver channel is connected,
wherein each driver channel comprises:
a first voltage driver having a first output configured to be connected to the respective transistor,
a second voltage driver having a second output configured to be connected to a the respective transistor,
a microcontroller for receiving test parameters from the personal computer, transmitting the test parameters to the first and second voltage drivers, receiving test results from the first and second voltage drivers, and providing the test results to the personal computer; and
means for simultaneously grounding all connections between the respective transistor under test and both the first voltage driver and the second voltage driver.

9. The system of claim 8, wherein each driver channel further comprises an analog-to-digital converter, and wherein for each driver channel, the first and second voltage drivers are configured provide the test results to the analog-to-digital converter and the analog-to-digital converter is configured to provide the test results in digital form to the microcontroller.

10. The system of claim 8, wherein for each driver channel, the first and second voltage drivers are constant voltage drivers which are set within the driver channel and are not set by voltage sources external to the driver channel.

11. The system of claim 8, wherein each driver channel further comprises an output ready flag, an output read flag, and a buffer for storing the test results, wherein for each driver channel said providing the test results to the personal computer comprises performing a loop, and wherein each iteration of the loop comprises:
transmitting a portion of the test results from the microcontroller to the buffer;
determining that the portion of the test results is ready to be read from the buffer, and in response setting the output ready flag;
determining that the output ready flag is set and in response, reading the portion of the test results from the buffer and providing the read portion of the test results to the personal computer and in response setting the output read flag;
determining that the output read flag is set and in response, determining whether said providing the test results to the personal computer is complete and if not then performing a next iteration of the loop until it is determined that said providing the test results to the personal computer is complete.

12. The system of claim 8, wherein each driver channel further comprises a test parameter ready flag and a test parameter read flag, and wherein for each driver channel said receiving test parameters from the personal computer comprises performing a loop, and wherein each iteration of the loop comprises:
determining that a portion of the test parameters is ready to be received by the controller from the personal computer, and in response setting the test parameter ready flag;
determining that the test parameter ready flag is set and in response, receiving the portion of the test parameters by the controller from the personal computer and in response setting the test parameter read flag;
determining that the test parameter read flag is set and in response, determining whether said receiving test parameters from the personal computer is complete and if not then performing a next iteration of the loop until it is determined that said receiving test parameters from the personal computer is complete.

13. The system of claim 8, wherein each voltage driver further comprises a ground, and wherein for each voltage driver:
the first output of the first voltage driver is configured to be connected to a source of the respective transistor, the second output of the second voltage driver is configured to be connected to a gate of the respective transistor, and the ground has a third output configured to be connected to a drain of the respective transistor.

14. The system of claim 8, wherein the means for simultaneously grounding all connections comprises:
means for grounding a voltage sensed signal from a first probe location on the respective transistor; and
means for constraining a voltage force signal from the first voltage driver to the respective transistor to be at a same voltage level as the voltage sensed signal.

* * * * *